US008373518B2

(12) United States Patent (10) Patent No.: US 8,373,518 B2
London et al. (45) Date of Patent: Feb. 12, 2013

(54) METHOD AND APPARATUS FOR DIGITAL SYNTHESIS OF LONG MULTI-CYCLE MICROWAVE PULSES

(75) Inventors: Simon Y. London, Rockville, MD (US); Oved Zucker, Annandale, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/159,680

(22) Filed: Jun. 14, 2011
(Under 37 CFR 1.47)

(65) Prior Publication Data

US 2011/0254607 A1 Oct. 20, 2011

Related U.S. Application Data

(62) Division of application No. 12/216,490, filed on Jul. 7, 2008, now Pat. No. 7,986,196.

(51) Int. Cl.
H04B 3/04 (2006.01)

(52) U.S. Cl. ............................. 333/20; 307/106; 307/96

(58) Field of Classification Search .................... 333/20; 331/96, 172, 173; 307/106, 419, 421
See application file for complete search history.

(56) References Cited

U.S. PATENT DOCUMENTS

| 4,176,295 A | 11/1979 | Driver et al. |
| 4,329,686 A | 5/1982 | Mourou |
| 5,109,203 A | 4/1992 | Zucker et al. |
| 5,185,586 A | 2/1993 | Zucker |
| 2006/0279372 A1 | 12/2006 | Zucker et al. |

FOREIGN PATENT DOCUMENTS

GB N/589127 6/1947

OTHER PUBLICATIONS

Mourou et al. "Picosecond Microwave Pulse Generation", Appln. Phys. Letters 38(6) (1981).
Proud et al "High Frequency Waveform Generation Using Optoelectronic Switching in Silicon" IEEE Trans on Microwave Theory and Techniques, vol. MTT-26, No. 3 (1978).

*Primary Examiner* — Stephen Jones
(74) *Attorney, Agent, or Firm* — Daniel J. Long; Bingham McCutchen LLP

(57) ABSTRACT

Conductive segments (transmission line conductors) are positioned within a transmission line structure in order to generate multi-cycle microwave pulses. The conductor segments are switchably coupled to one or the other conductor of the transmission lines, inside the transmission line structure. Microwave pulses may be induced in the transmission line by closing the switches in a controlled manner to discharge successive segments, or successive groups of segments, into the transmission lines. The induced pulses travel uninterrupted along the transmission lines in a desired direction to the load. Efficiency of systems and energy delivered to the load in multi-section transmission lines is increased and/or maximized by adjusting the ratio of characteristic impedances associated with the transmission line conductor segments according to an optimum ratio.

14 Claims, 7 Drawing Sheets

METHOD AND APPARATUS FOR DIGITAL SYNTHESIS OF LONG MULTI-CYCLE MICROWAVE PULSES

CROSS REFERENCE TO RELATED APPLICATIONS

This application is a divisional application of U.S. patent application Ser. No. 12/216,490 filed Jul. 7, 2008 and contains subject matter that is related to the following patent applications: U.S. patent application Ser. No. 11/147,452, entitled Method And Apparatus For Digital Synthesis Of Microwaves Through Balanced Transmission Structures; and Re: U.S. patent application Ser. No. 11/147,453, entitled "Method And Apparatus For Digital Synthesis Of Microwaves."

FIELD OF THE INVENTION

The present invention relates to a method and apparatus for generating microwaves and more particularly to a microwave source and a method for generating microwaves by digital synthesis.

BACKGROUND OF THE INVENTION

Digital synthesis of microwaves uses transmission lines and switches to generate a series of alternating polarity pulses. The coupling of the resulting pulse train to a load such as an antenna results in the radiation of a short microwave pulse. This approach has been investigated for over 30 years.

The general concept of producing microwaves by a sequential operation of switches is well known. High peak power microwave generation is addressed by Driver et al. in U.S. Pat. No. 4,176,295 in which the generation of microwaves by periodically discharging a plurality of identical, direct current energized, resonant transmission lines into a TE wave guide at multiple half-wavelength spacing is discussed. To periodically discharge the transmission lines, each line is provided with a switch, and all switches are simultaneously operated to cause the electromagnetic energy in the waveguide to propagate as a pulse train of microwave energy.

Mourou, in U.S. Pat. No. 4,329,686 discusses an arrangement, similar to that of Driver et al., which uses a TE waveguide and a light activated, solid state (LASS) switch for generating microwave pulses Of picoseconds duration, synchronously and in response to laser light pulses.

Unfortunately, the arrangements described by Driver et al. and Mourou do not produce clean microwave pulses and are limited in power since TE waveguides have impedances close to that of free space, typically 50 ohms or more, and therefore cause the LASS switches to operate outside the electric field and current density limits consistent with good high power design principles, specifically, unidirectional power flow in a continuously matched system.

Zucker, in "Light Activated Semiconductor Switches," UCRL Preprint, October 1977 discusses the use of a light-activated semiconductor switch, the basic principle of which is to create carriers in situ, thus obviating the need for diffusing the carriers necessary to transition a transistor or thyristor switch from a reversed biased (OFF) condition to a forward biased (ON) condition. Zucker discusses the use of a laser beam whose frequency is matched to the switching device band gap (1.09 eV for silicon) to turn ON a LASS switch in less than 1 ps. As discussed in the article, a switch having sub nanosecond turn on time, and capable of being turned off after current ceases to flow, would be required for microwave generation in order to allow for quick recharge and refire and for the establishment of coherence among independent microwave sources.

Such a switch is addressed by Proud et al. in their article "High Frequency Waveform Generation Using Optoelectronic Switching in Silicon" IEEE Trans on Microwave Theory and Techniques, Vol. MTT-26, No. 3 (1978), in which the conversion of dc energy into RF pulses by using an array of silicon switches simultaneously activated by a laser pulse is discussed. Proud et al. describe a "frozen wave" generator comprising arrays of high-resistivity silicon switches fired by a gas laser designed to simultaneously fire all of the switches in synchronism. Both Zucker and Proud techniques are represented by FIG. 1, which discloses a group of transmission lines connected together by switches. In Zucker, the switches are activated sequentially, which gives flexibility in resulting wave shape, while in Proud the switches are activated simultaneously and produce frozen wave pulses. In both, the switches remain in the ON state during the transmission of the entire pulse train through the closed switches.

Mourou et al. in their article entitled "Picosecond Microwave Pulse Generation", Appl. Phys. Letters. 38(6) (1981) discuss the generation of a microwave burst in picosecond's synchronization with an optical pulse using a LASS switch coupled to an x-band waveguide and describe the efforts of others to generate microwave pulses using electrically driven spark gaps and frozen wave pulses.

In U.S. Pat. Nos. 5,109,203 and 5,185,586, Zucker et al. teach:

(1) Sequential switching of two or more cascaded TEM transmission lines of arbitrary lengths, each transmission line being charged to an arbitrary voltage where the delay between any two switching events is equal or greater than the temporal length of the transmission line separating them with the first switch activated (closed) being the one closest to the load.

(2) The use of an optimized transmission line and switch geometry to yield the highest possible power flow.

(3) A "folded" microwave source configuration to provide added compactness and simplified energizing of the transmission lines.

(4) The use of reverse biased light activated solid state diodes as switches to provide for extremely rapid switch recovery upon recharging of the transmission lines after discharge, the recharging operating to forcefully reverse bias the diodes.

Despite the above advantages, the implementation of a transmission line as a series of segments coupled together by switches causes problems when trying to provide a number of pulses in series. This is because each pulse within sequential switching systems or frozen wave systems travels through several closed switches implemented in series. Therefore, the signal level attenuates as the signal propagates through each closed switch due to the residual resistance of each closed switch. Thus, sequential switching systems are not desirable for certain applications because of attenuation problems and are limited by a low number of pulses. Therefore, energy delivered to resistive load is relatively low.

A circuit called a Blumlein generator (U.K. Patent N/589127, 1941), depicted in FIG. 1B, has been used and based on a voltage inversion principle to generate power. The Blumlein generator operates using two identical two conductor lines. They can be incorporated in a single three conductor transmission line. In the latest version, the central conductor is charged to a voltage (V) relative to each of the outer two conductors. A single switch connects the central conductor to one of the outer conductors. When the switch is closed, the voltage on the switched line is inverted and, after a time equal to the delay of this line, both lines start to discharge to a load, converting the full stored potential energy into power on the load during double transit time of the line.

The Blumlein generators may be implemented in a stacked configuration (for increasing power) to enable the conversion of power from more than two transmission line segments. This is shown in FIG. 1C as one of the options for two stacked Blumlein generators. The stacked Blumlein generators, like the conventional Blumlein generator, generate a single unipolar pulse when all switches are closed (at the same time) that drives the load after the equal time delay of each line. Neither the Blumlein generator nor the stacked one, however, has been used for digital synthesis or to generate microwave signals in a series of bipolar pulses on the common load.

Related patent applications by Oved Zucker disclose digital synthesis of microwaves based on transmission line conductive segments where the transmission line conductive segments are coupled to continuous transmission-line conductors by closing switches which are connected in parallel with transmission line conductors, rather than in series. See co-pending patent application Ser. No. 11/147,453. This permits the number of transmission line segments or transmission-line sections to be increased. However, when the number of sections increases substantially, the full electrical (and physical) length of the multi-sectional generator also increases proportionally. With the increase in physical and electrical length, however, conductive losses associated with generating pulses traveling to the load also increase and the efficiency of the generator decreases. Therefore, even in configurations with switching elements positioned in parallel to transmission lines, conductive losses can quickly predominate and practically limit the number of sections implemented. As a result, there is limited power and energy delivered to the load.

To improve efficiency and increase energy at the load, the characteristic impedances of both transmission lines in each section should be increased. However, for a given fixed maximum voltage on each switch, this causes the power/energy to be decreased and there will be some optimum for the selected number of sections and particular specifications depending on the implementation. In all cases, to achieve the high power/energy on the load, the number of section is a principal limitation.

Accordingly, there is a need to increase the power, energy and efficiency of digital synthesis systems. There is a further need for a digital synthesis system capable of creating long pulses efficiently. There is still a further need for a digital synthesis system capable of maximizing the power and efficiency for a variety of multi-cycle pulse length and power and pulse requirements.

SUMMARY OF THE INVENTION

According to the present invention, conductive segments (transmission line conductors) with thickness t are positioned within a transmission line structure in order to generate multi-cycle microwave pulses. The conductive segments are switchable coupled to one or the other conductor of the transmission lines, inside the transmission line structure. Microwave pulses may be induced in the transmission line by closing the switches in a controlled manner to discharge successive segments, or successive groups of segments, into the transmission lines. The induced pulses travel uninterrupted along the transmission lines in a desired direction to the load. Efficiency of systems and energy delivered to the load according to the present invention is increased and/or maximized by adjusting the ratio of characteristic impedances associated with the positions of transmission line conductive segments according to an optimum ratio.

According to one embodiment of the invention, an apparatus for generating a plurality of electrical pulses on a transmission line includes at least two transmission line conductors and at least 10 conductive segments interposed between and electrically isolated from the two transmission line conductors. Each segment is coupled to one of the transmission line conductors through a switch and is capable of being charged and discharged to create a microwave pulse train on the transmission line conductors. To facilitate high power pulse trains with minimum losses, the segments and transmission line conductors are configured to obtain a ratio of impedance between the segments and one of the transmission line conductors and the segments and the other one of the transmission line conductors of at least 10:1. According to other embodiments of the invention, the ratio of impedance is 20:1 or greater and the switches comprise optically activated switches.

According to another embodiment of the invention, an apparatus for generating a plurality of electrical pulses includes at least two transmission line conductors and a plurality of electrical conductors (segments) interposed between mentioned two transmission line conductors. The at least two transmission line conductors are positioned at a distance D2 and have characteristic impedance (impedance) Z2 between this first continuous transmission line conductor and each conductive segment. These segments are also positioned at distance D1 from the second transmission line conductor. This distance D1 gives characteristic impedance Z1 between each segment and the same length of continuous second transmission line conductor. Each segment is capable to being charged relative to both (first and second) transmission line conductors. Each segment is also operatively connected through a switch to discharge the conductive segments to create a pulse, which propagate on the transmission line. In addition, the ratio of D2/D1 is selected to create an impedance ratio that is near optimum for efficiency and for amount of energy transfer to the load.

There are many ways to implement the segments according to embodiments of the present invention. For example, the plurality segments may include pairs of conductive segments that are discharged at the same moment of time. Each conductive segment within each pair of conductive segments may be charged to the same or a different voltage potential relative to one another depending on the implementation. In addition, adjacent pairs of conductive segments may be charged to a different voltage potential relative each other. The conductive segments may include upper conductive segments coupled to an upper one of the transmission line conductors through the switches and the conductive segments may include lower conductive segments coupled to a lower one of the transmission line conductors through the switches. Alternatively, the upper and lower conductive segments may be coupled to each other through switches. Regardless of these arrangements, D1+D2+t=D. and D1 and D2 are not equal.

According to another embodiment of the invention, a method of generating microwave signals includes first switching to discharge at least one first segment into transmission line conductors and second switching, after a period of delay, to discharge at least one second segment into transmission line conductors in order to create a bipolar pulse, wherein one (first) transmission line conductor is positioned a distance D2 apart from conductive segments 1, 3, 5, . . . and have an impedance Z2 and wherein the segments are positioned within the transmission line structure at a distance D1 from the corresponding second transmission line conductor and has an impedance Z1 and wherein the ratio of D2/D1 is selected to create an impedance ratio that is near optimum for efficiency and amount of energy transferring to the load.

Accordingly, the interposed segments 2, 4, 6, . . . are positioned at distance D1 from the first transmission line conductor and at distance D2 from the second transmission line conductor. The second and each following switching may occur after the first (previous) switching by an amount of time determined to allow a wave generated in the transmission line conductors by the second switching to join the tail of a wave generated in the transmission line conductors by the first (previous) switching.

By increasing the ratio D2/D1 and keeping a low-Z impedance, i.e. low D1, conductive losses in pulses propagated to the load decrease due to lower currents. On the other hand, typically, when the ratio D2/D1 increases, the mismatch in extracting the energy from low-Z lines is also increased and more reflections introduce more losses in low-Z lines. However, all lines are charged and in the first few sections the number of "active" reflections gradually decreases. For each of the following sections, the number of meaningful reflections in the low-Z lines is lower compared to that expected from the large D2/D1 ratio. This gives a very efficient (low loss) process of extracting energy from high energy storage, low-Z lines, and in combination leads to a low transfer losses to the load even for a high number of sections. The resulting improvement in total load energy (longer overall pulse length with higher power) comes at the expense of increased volume of the transmission-line system.

BRIEF DESCRIPTION OF THE DRAWINGS

The above described features and advantages of the present invention will be more fully appreciated with reference to the detailed description and appended figures in which.

DETAILED DESCRIPTION

According to the present invention, conductor segments (transmission line conductors) are positioned within a transmission line structure in order to generate microwave pulses. The conductor segments are switchably coupled to one or the other conductive segment of the transmission lines, while the switches are connected between adjacent segments in the transmission line structure. Microwave pulses may be induced in the transmission line by closing the switches in a controlled manner to discharge successive segments, or successive groups of segments, into the transmission lines. The induced pulses travel uninterrupted along the transmission lines in a desired direction to the load. Efficiency of systems according to the present invention is increased and/or maximized by adjusting the impedance ratio associated with the transmission line conductor segments relative to the transmission lines according to an optimum ratio. In all cases, the lowest characteristic impedance Z1 is referred to as the transmission line with switches and the value of Z1 may depend on the maximum voltage acceptable for the switch which is assumed to be fixed.

Figure 1A:
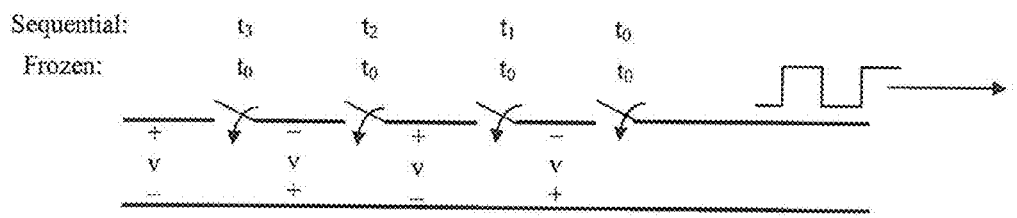
FIG. 1A depicts a method of generating microwave pulses according to the prior art.
Figure 1B:
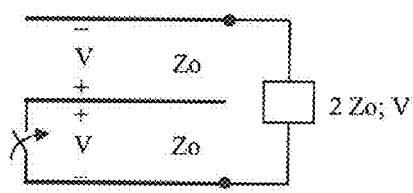
FIG. 1B depicts a schematic of a Blumlein generator according to the prior art.
Figure 1C:
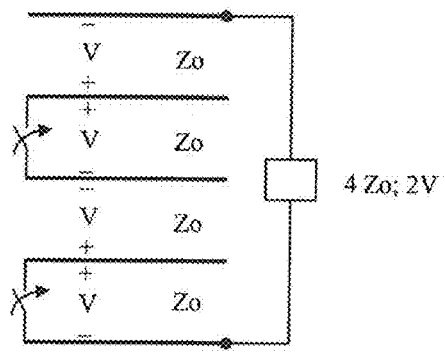
FIG. 1C depicts two stacked Blumlein generators according to the prior art.

Transmission lines without switches have higher characteristic impedance Z2, and the preferable ratio of Z2 to Z1 typically increases with increasing numbers of sections, because the overall length of the generator increases. The optimum value for the ratio Z2/Z1 is a compromise between overall storage energy in transmission lines (requires lower ratio Z2/Z1 and losses during transmission (requires higher ratio Z2/Z1). That is why the optimum ratio, which provides the maximum energy delivered to the load increases with increasing numbers of sections. For a single section, i.e. for Blumlein generator (FIG. 1B) the optimum ratio is equal to 1, i.e. Z2=Z1.

For a large number of sections ($\geq 100$), the total dimension of the generator (including folded design) could be the practical limiting factor when implementing an optimum value of Z2/Z1. In such cases, compared to the electrical optimum, a lower value of Z2/Z1 could be chosen.

Figure 2:
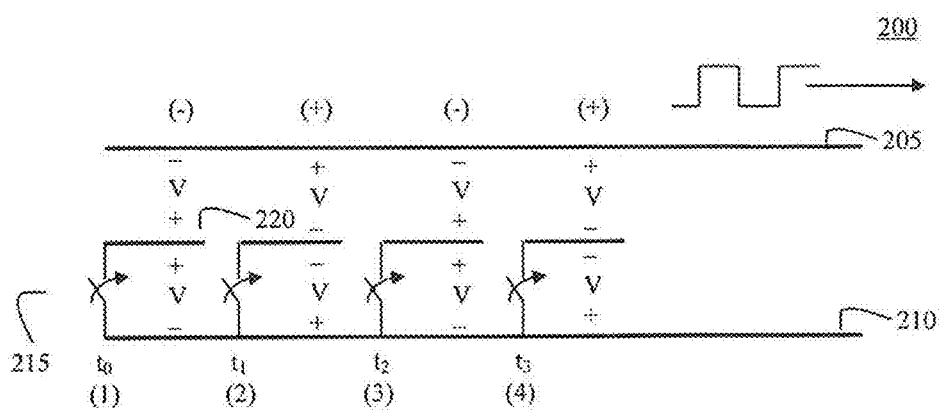
FIG. 2 depicts an embodiment shown in a related application of implementing transmission line segments having alternating polarity and equal time delay $\tau$.

FIG. 2 depicts a digital synthesis transmission line structure 200 that generates microwave pulses according to copending U.S. patent application Ser. No. 11/147,453. Referring to FIG. 2, the digital synthesis transmission line 200 includes two continuous conductors 205 and 210 on either side of a plurality of center transmission line segments (conductors) 220. These segments within parts of conductors 205 and 210 have the same length as the parts of the conductors 205 and 210 and each segment 220 with corresponding parts of conductors 205 and 210 forms two stacked transmission lines as a section of a full structure.

The first conductive or central segment is charged to a different voltage than the adjacent central segments 220 relative to surrounding conductors 205 and 210. The first segment 220 has a positive charge relative to the surrounding conductors 205 and 210. Adjacent central segments 220 have opposite polarity. Thus, for example, adjacent center segments may be charged as a series to +V, −V, +V, −V, as shown. The structure 200 further comprises switches 215 that couple each center segment 220 to the conductor 210.

During operation, each of the switches 215 is closed in a desired sequence. The discharge of each center segment 220, i.e. discharge of lower and upper transmission lines in a single section associated with a corresponding segment 220, generates a single rectangular pulse. This pulse in the transmission line with conductors 205 and 210, predominantly travels to the right. (A fraction also travels to the left as discussed below). The voltage generated by discharging the first center segment 220, shown as (1), travels only to the right.

Referring to FIG. 2, as the pulse travels to the right in the transmission lines (205 and 210) from the closing of the first switch shown as (1), it passes the beginning of the second central segment, and the switch shown as (2) is closed, and the second center segment 220, which is charged negatively, is discharged through switch (2) into the transmission lines (205 and 210). This produces a similar pulse traveling to the right. However, the pulse has the opposite polarity when compared to the pulse induced by the first segment, and some energy travels backward along the transmission lines. The backward flow of energy in the transmission lines formed by conductors 205, 210 and the second segment of 220 is impeded by both: impedance mismatch and the presence of the still closed first switch of the first segment 220, which results in small reduction in forward energy flow. Switches (3) and (4) are also closed one after the other when the pulse train passes each respective switch.

Using the structure of FIGS. 2, a train of pulses having alternating polarities is produced. The number of pulses is determined by number of conductive segments and corresponding switches. The width and height of the pulses may be varied by varying the. geometry of the center segment relative to the conductors 205 and 210, the dielectric constant of material within the transmission line structure, and the distance of the central conductor segment from the upper and lower surfaces 205 and 210, among other variations. As discussed further below, other factors affecting the waveform produced by the structure 200, which are controllable to produce a desired effect, include the amount of charge placed on each segment (center conductor 220) and the timing of turning on (closing) each of the switches 215.

Figure 3:
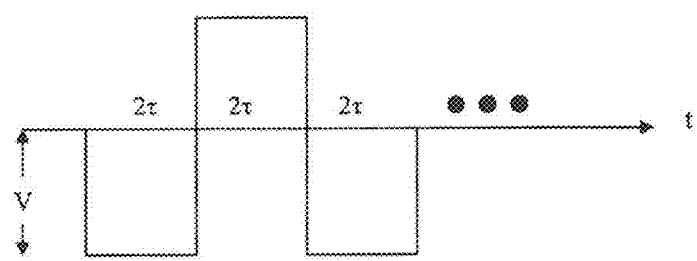
FIG. 3 depicts an ideal generating pulse train produced by lossless transmission line structures according to the embodiment of FIG. 2.

FIG. 3 depicts a sample of ideal bipolar pulses in a train waveform produced and traveling to the right by a structure such as that shown in FIG. 2. Some distortions of a pulse train due to reflections for pulses #2, 3, 4, etc. are not shown. Referring to FIG. 3, the amplitude of the bipolar pulse is +V and −V. The width of each polarity pulse is $2\tau$, where $\tau$ is the transit time along the length of each line formed by corresponding conductive segments. When equal conductive segments are spaced immediately next to each other, and there is no space in time between positive and negative pulses, it generally takes $3\tau$ from the closing of a switch for the pulse to pass the beginning of the next conductive segment and closing the next switch. By closing the switches (1), (2), (3), (4) in $3\tau$ increments, the ideal pulse train as shown in FIG. 3 is created in the main direction. The quality of this train (which is slightly distorted by reflected pulses traveling to the left at the beginning) can be improved by using two loads, as shown in FIG. 8B with matched back-side loads.

Figure 4:
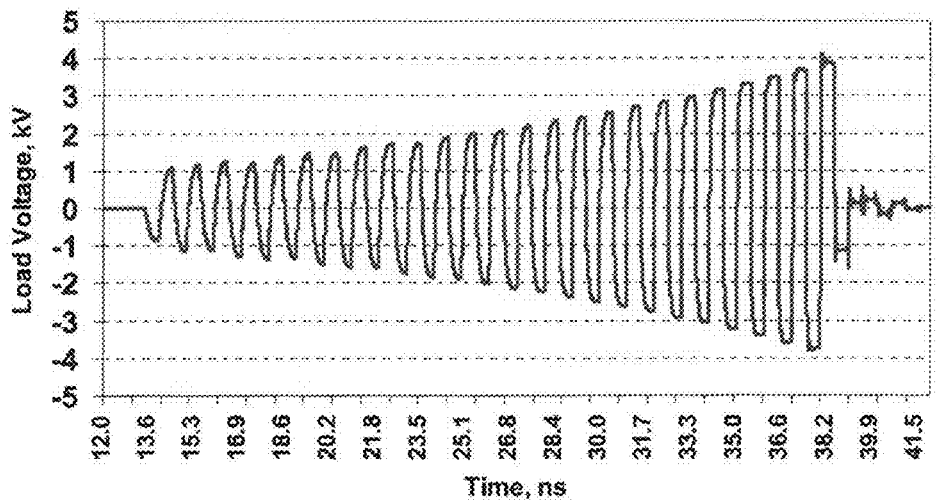
FIG. 4 depicts an exemplary pulse generated by the digital synthesis implementation of FIG. 2, where 50 sections with real losses are implemented.

FIG. 4 depicts an exemplary pulse generated by the digital synthesis implementation of FIG. 2. Referring to FIG. 4, the pulse (or pulse train) illustrated is produced on the main load (on the right side) of the illustrative circuit of FIG. 2 for a particular case in which the number of sections is equal to 50, voltage on the switch (VSWR) or charging voltage is 5 kV and there is equal separation between parallel plate copper conductors so that Z1=Z2=Z and D1=D2=D=2 mil, a spacing that may be created with a typical dielectric, including a kapton dielectric. The width (W) of transmission line conductors (assuming practical cases when W>>D), i.e. their characteristic impedances and corresponding load impedance 2Z does not affect on efficiency. Efficiency may be calculated as a ratio of energy delivered to the load to energy stored in all transmission line sections before switching.

The illustrative graph of FIG. 4 shows that the amplitudes of the pulses on the right side of the graph are high and that the amplitude of pulses gradually diminishes toward the left side of the graph. The pulses on the right side correspond to pulses produced by transmission line sections that are close to the main load on the right side of the generator of FIG. 2. The pulses on the left side correspond to pulses generated by transmission line sections that are on the left side of the pulse generator, and as such, these pulses have been attenuated by the further physical and electrical distance they must traverse to reach the main load. FIG. 4 shows the relatively high attenuation of pulses produced in sections that are relatively far from the main load. It will be understood that additional loads may be implemented on the left side of the pulse generator, for example a matched load, to absorb low power and energy pulses and thereby provide better pulse shape by absorbing reflected waves.

Somewhat better efficiency and more power transfer may be achieved in balanced configurations as described in co-pending U.S. patent application Ser. No. 11/147,452. Additional effects in power/efficiency may be achieved in structures shown in FIGS. 13, 14, 15 in U.S. patent application Ser. No. 11/147,452 due to the elimination of more than one conductor with equal currents in opposite directions. All of these effects, however, require more complicated structures and switches located inside of structures (i.e., FIGS. 9, 10, 12-15 in U.S. application Ser. no. 11/147,452). When photoconductive switches placed inside of a structure, they are more difficult to access and activate by light propagated in fibers. However, multi-section, multi-cycle bipolar pulse generators, as shown in FIG. 2, in accordance with co-pending U.S. patent application Ser. No. 11/147,453, have not delivered optimum efficiency, energy or power as was illustrated above on FIG. 4.

Besides this, for a given maximum voltage per switch, the highest power/energy that could be achieved was implemented using transmission lines having low characteristic impedance. Practically, however, for multi section bipolar pulse generators the effective impedance of the multiple transmission line sections may be in the mOhm range. Therefore, transformers are needed to significantly step up the impedance to match commonly used output loads of 50 Ohms or higher for the purpose of radiation. Such transformers (stepped-lines or exponential taper) generally do not provide high efficiency and have a large size because the impedance transition occurs along their length. As a result, implementing low impedance transmission lines for multi section transmission lines may not be a practical solution to improve efficiency and power transfer in all cases.

Figure 5:
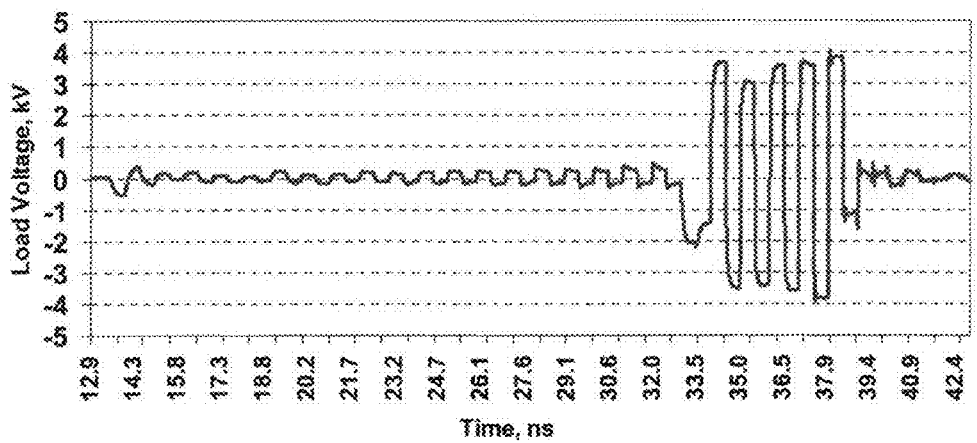
FIG. 5 depicts an exemplary pulse generated by the digital synthesis implementation of FIG. 2, where a short-circuit failure occurs in the switching segment number 40 out of 50-sectional generator.

Another problem with the implementation discussed above is that as soon as the number of sections increases, the probability of a switch failure (breakdown or non-activation by light) is increased. FIG. 5 illustrates the result of a catastrophic failure section (breakdown) of a switch in section #40 in a 50-section transmission line structure with equal (or almost equal) characteristic impedances implemented as shown in FIG. 2. We assume the worst case is when the failed switch is short-circuited, resulting in the shorting of a transmission line. FIG. 5 shows that as a result of such a switch failure, all pulses generated by sections 1, 2 . . . , 39 (to the left of the failed switch) are suppressed by the short-circuit in section #40. The pulses generated by all switches and transmission line segments to the right of section #40 still propagate to the load. The short circuited line operates in effect as a series connected inductive stub for all pulses generated in preceding sections. Accordingly, there is still a need for a pulse generator that does not suffer from the severe negative effects of a catastrophic switch failure on the pulses generated by the structure.

Figure 6:
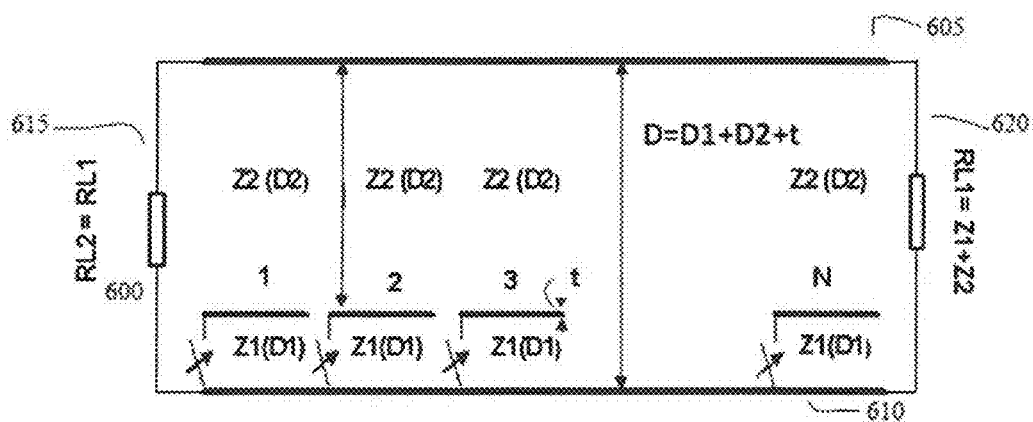
FIG. 6 depicts an embodiment of the present invention wherein the segments have alternating polarity and an equal time delay $\tau$, and wherein the segments with switches are positioned closer to one transmission line than the other by a ratio of D2 to D1 which causes the impedance of Z2 to be greater than the impedance of Z1, according to an embodiment of the present invention.

The above mentioned problems are solved in embodiments of the present invention. An exemplary implementation is shown in FIG. 6. Referring to FIG. 6, a series of N transmission line segments 600 are positioned between two conductors 605 and 610 respectively. Each segment is coupled to the conductor 610 through a respective switch. This configuration creates two transmission lines for each segment (one section of structure), with impedance Z2 for the transmission line formed by segment 600 and conductor 605 at a distance of separation of D2. The other transmission line has an impedance Z1 formed by segment 600 and conductor 610 at a distance of separation of D1 in the same section. In this configuration, the line segments 600 with switches 1, 3, 5 . . . , (every other segment) are charged positively (or negatively) with respect to their common conductor 610, while transmission lines Z2 without switches are oppositely charged relative to the corresponding line segments 600. The even line segments 2, 4, 6 . . . have an opposite charge relative to the odd segments 1, 3, 5 . . . . The resulting voltage between upper and lower common conductors connected at the end of the last section to the load is equal to zero in each section. According to the present invention, the impedance ratio Z2/Z1 should be high, and consequently the ratio D2/D1 is also high, particularly when the dielectric implemented is the same between 600 and 605 and 600 and 610. In the case of a high ratio of Z2/Z1, the sources of attenuation are as follows: (i) there is attenuation as a result of propagation of pulses generated by each section over the transmission line toward the main load 620 (RL1) with Z=Z1+Z2; and (ii) there is a attenuation of pulses generated by each section due to reflections in each cross-section between transmission lines with characteristic impedances Z1 and Z1+Z2 where impedance ratio equals (1+Z2/Z1). The load 615 (RL2) at the left end of the generator helps to dampen down the effect of reflected waves that reaches the load RL1 at the right end.

To increase the area of application of the pulse generator according to FIG. 6 the electrical length of segments 600 may be not equal. For a different electrical length of some segments a different pulses width (different main frequencies) may be realized. Besides, different impedances Z1 and/or Z2 for different sections also may be realized for optimum overall efficiency of generator.

Figure 7:
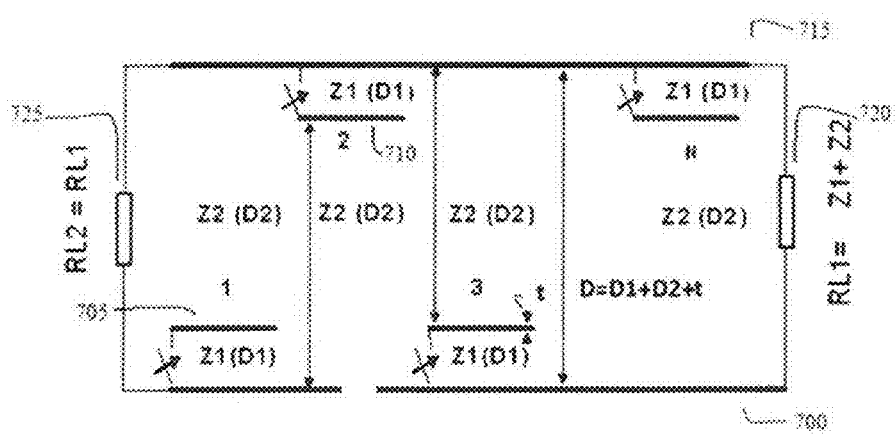
FIG. 7 depicts an embodiment of the present invention wherein the segments are charged to the same polarity and have equal time delay $\tau$, and wherein the segments with switches are positioned closer to one transmission line than the other by a ratio of D2 to D1 which causes the impedance of Z2 to be greater than the impedance of Z1, according to an embodiment of the present invention.

FIG. 7 depicts another implementation of the generator according to an embodiment of the present invention. Referring to FIG. 7, unlike the generator of FIG. 6, the transmission line segments 705 and 710 are respectively coupled through switches to transmission line conductors 700 and 715 in an alternating fashion. Each segment is positioned a distance D1 from the corresponding continuous conductor of transmission line and has an characteristic impedance of Z1.The conductive segments 705 and 710 are separated by a distance of D2, or by characteristic impedance of Z2. The resulting characteristic impedance of each section is Z1+Z2 in which each single pulse is generated and than traveling to the main load 720 (RL1) on the right side and to load 725 (RL2) on the left side. The transmission lines in all sections with impedance Z1 (connected to switches) are all charged in the same polarity with respect to corresponding common conductors 700 and 715, unlike FIG. 6 where the polarity alternates.

Notwithstanding the differences in structure, the wave's propagation is the same for both generators shown in FIGS. 6 and 7. However, the structure, of FIG. 7 may be suitable for a folded design when all switches are located on the periphery of the structure, facilitating activation. A cross-section of a four-sectional folded design is illustrated in FIG. 8.

Figure 8:
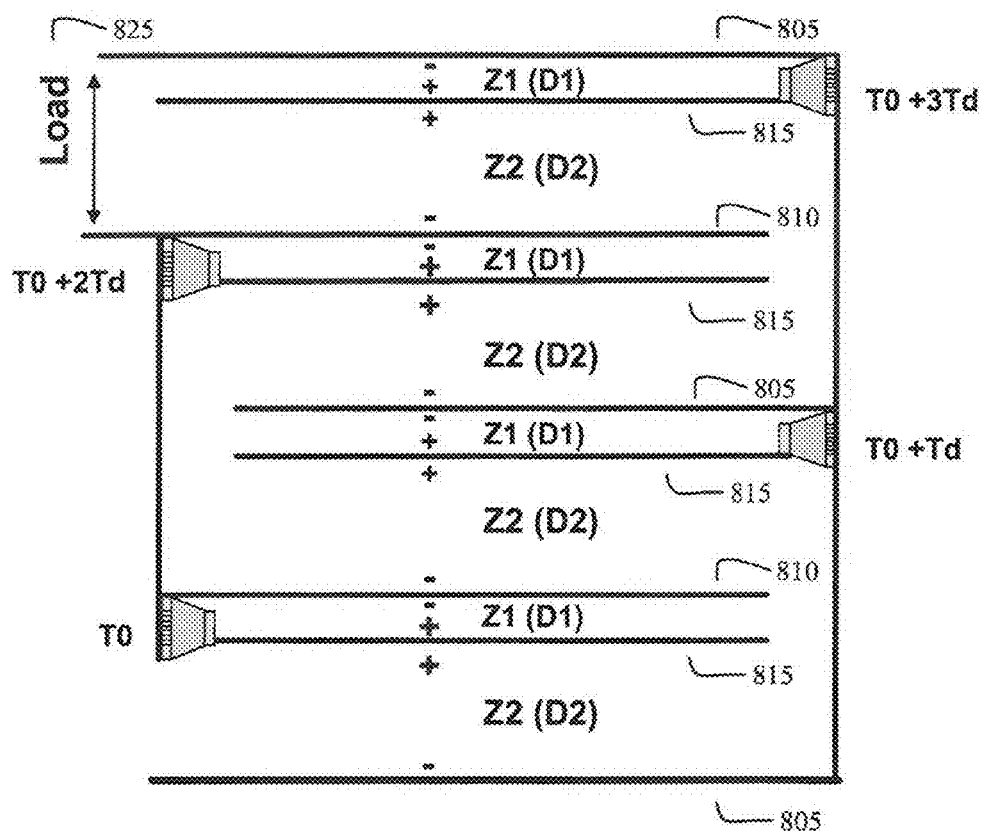
FIG. 8 depicts a folded implementation of a four section pulse generator according to an embodiment of the present invention.

FIG. 8 depicts a folded four-section design based on structure FIG. 7. It should be noted that real proportions in dimensions are not illustrated on FIGS. 6, 7 and, especially, in FIG. 8. Typically, the length of segments are much larger than D1+D2. Referring to FIG. 8, common transmission line conductors 805 and 810 are positioned in a folded configuration around transmission line segments 815 and represents transmission line conductors 715 and 700 respectively. The transmission line segments 815 are all charged positively relative to the common conductors, but yet are coupled in an alternating fashion through switches 820 to conductors 805 and 810. These segments represent segments 705 and 710 sequentially. Thus, this folded design FIG. 8 electrically resembles FIG. 7 and produces pulses at a load 825. The switches are also positioned at the edges of the structure facilitating their access and control by fibers. The time delay Td is equal 3 τ, as discussed above for FIG. 3.

Let's consider some basics in choosing ratios D2/D1 for FIGS. 6, 7 and 8. Assuming the case when ratio D2/D1 is very high compared, for example, with the number of sections. Practically, in this case the characteristic impedance Z1+Z2 is high enough relative to Z1 and provides low losses during transferring of pulses to the load. These losses will be much lower compared to the losses in the process on many reflections in cross-sections between impedances Z1 and Z1+Z2. It should be noted that the energy initially stored in transmission lines with impedances Z1 and Z2 is always more than half of the energy stored in prior art generator's with high attenuation when Z2≈Z1. There is an optimum ratio Z2/Z1 dictated mostly by the given value of Z1 and the number of sections.

Figure 9:
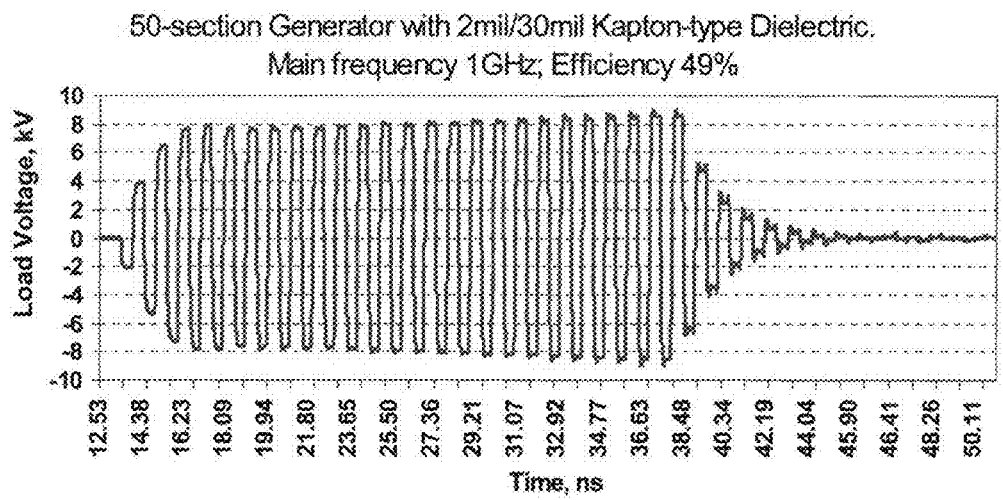
FIG. 9 depicts an exemplary illustration of a waveform on the load produced by a 50-sections generator according to one embodiment of the present invention.

For comparison with other structures discussed above, which perform as shown in FIG. 2 for a 50-section generator. FIG. 9 shows the performance at the structures of FIGS. 6, 7 and 8 the same Z1 and a ratio of Z2/Z1=15. The result, shown in FIG. 9, is a significant increase in efficiency compared to FIG. 4. The energy on the load is also increased by 50% compared to the case of FIG. 4, in spite of the charged energy being about 50% lower because of the high ratio of Z2/Z1. The chosen ratio of Z2/Z1 in this example is near the optimum for maximum energy delivered to the main load.

Figure 10:
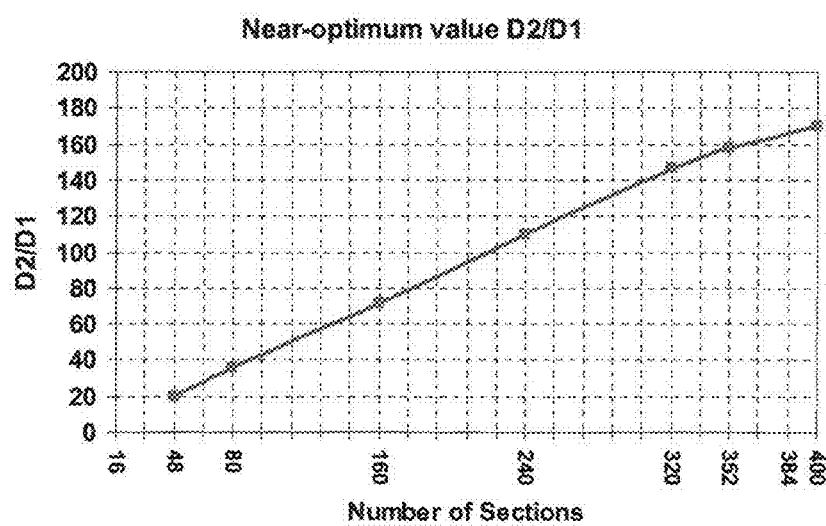
FIG. 10 depicts a near optimum value of the ratio of D2/D1 for implementations of pulse generators using multiple section transmission line structures according to an embodiment of the present invention.

If the number of sections increased, the optimum ratio of Z2/Z1 increases. The graph in FIG. 10 represents a finding that illustrates the tendency of the optimum ratio of Z2/Z1 to increase with the number of sections in a generator where a 2-3 mil, low dielectric constant material is chosen for D1, and for high frequency pulses. All variations in the length of conductive segments and in impedances Z1 and/or Z2, as discussed for FIG. 6 are applicable for FIGS. 7,8 and for followed FIG. 11.

Figure 11:
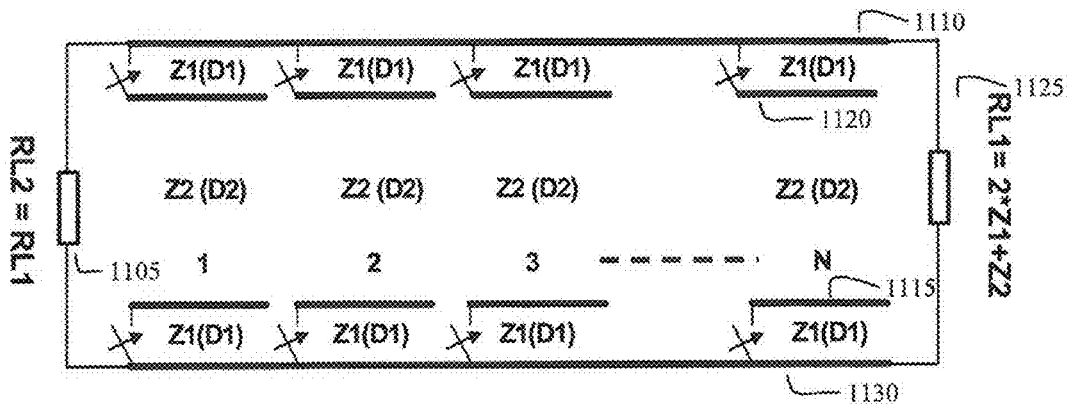
FIG. 11 depicts a balanced implementation of pulse generator according to an embodiment of the present invention.

In addition to the structure shown in FIGS. 6, 7 and 8, better efficiency and double power will be achieved in balanced configurations, such as the one shown in FIG. 11.

Referring to FIG. 11, transmission line conductors 1105 and 1110 surround transmission line segments 1115 and 1120. At the right side, the transmission lines are coupled to a main load 1125 and at the left side to a load 1130. The transmission line segments 1115 and 1120 are coupled to their corresponding transmission line at a distance D1 and have impedance Z1. The segments 1115 and 1120 are oppositely charged and pairs of switches at the same stage are activated together to create a double voltage pulse. It should be noted that the principle of increasing ratio of characteristic impedances of transmission lines without switches to characteristic impedances of transmission lines with switches may be applied to structures shown on FIGS. 13,14,15 in co-pending U.S. patent application Ser. No. 11/147,452.

Figure 12:
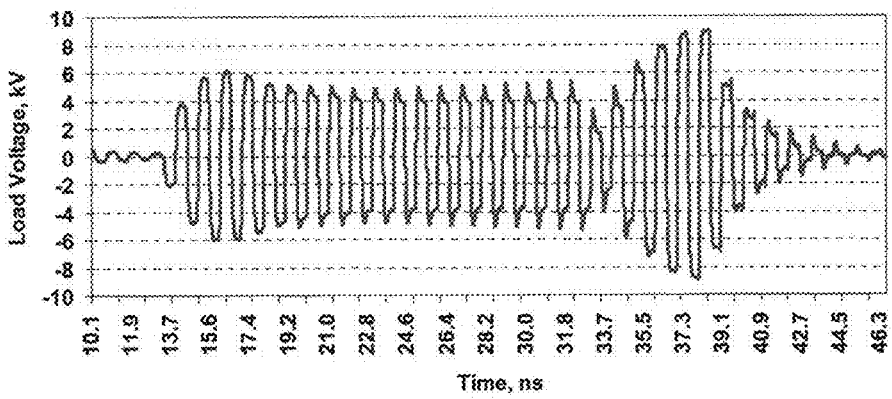
FIG. 12 depicts an exemplary illustration of a pulse produced on the load by a 50-sections generator after a short-circuit failure of the switch in section #$40^{th}$ according to one embodiment of the present invention.

FIG. 12 shows the effect of a catastrophic switch failure, and in particular, the same case as was shown in FIG. 5 for D1=D2. Accordingly, a switch is short circuited at #40. The results of modeling, shown in FIG. 12, reveal that in contrast to the case where D1=D2 (Z1=Z2), all pulses generated by sections 1, . . . , 40 have substantial power and supply high energy to the load. In this case, as before the switch at transmission line segment #40 short circuited, operates as a series connected stub for all pulses generated by the preceding sections. However, the impedance of this transmission-line stub is 15 times lower compared to characteristic impedance of long transmission line with impedance Z1+Z2 (Z2>>Z1), in which generated pulses are traveling to the load 1125. This difference provides a much lower negative effect compared to the case where Z1≈Z2. As a result, the many times increase in characteristic impedance Z2 of non-switched lines with respect to Z1 (which is mostly "responsible" for power and energy), allows one to achieve (i) higher efficiency and power/energy on the load; (ii) higher load impedance requiring a much lower transformation and lower losses due to lower current; and (iii) Much lower negative effect in the worst case of catastrophic switch failure: short-circuited switched transmission line(s).

While particular embodiments of the invention have been shown and described, it will be understood by those having ordinary skill in the art that changes may be made to those embodiments without departing from the spirit and scope of the present invention.

What is claimed is:

1. An apparatus for generating a plurality of electrical pulses on a transmission line, comprising:
    at least two transmission line conductors at a distance D, having characteristic impedance Z;
    a plurality of conductive segments with thickness t interposed between and electrically isolated from the two transmission line conductors, wherein the segments are capable of being charged and discharged to create a microwave pulse train on the transmission line conductors, and the conductive segments include upper conductive segments coupled to an upper one of the transmission line conductors through the switches and the conductive segments include lower conductive segments coupled to a lower one of the transmission line conductors through the switches,
    wherein the segments are positioned a distance D1 from a corresponding one of the transmission line conductors, D1+D2+t=D, where D1 and D2 are not equal, and a ratio of D2/D1 is chosen to be near optimum for efficiency and energy transfer, and odd numbered segments are switchably coupled to and positioned at distance D1 from one of the transmission line conductors and even numbered segments are switchably coupled to and positioned at a distance D1 from the other one of the transmission line conductors.

2. The apparatus according to claim 1, wherein all of the segments are charged to the same voltage potential.

3. The apparatus according to claim 1, wherein the segments are switchably coupled to the same one of the transmission line conductors and adjacent segments are alternatively charged to one of at least two different voltage potentials relative to each other.

4. The apparatus according to claim 1, wherein distances D1 and D2 may be varied from one conductive segment to another.

5. The apparatus according to claims 1, wherein the conductive segments have a length that may be varied from one conductive segment to another.

6. The apparatus according to claim 1, wherein all conductive segments may be charged by different voltage potentials.

7. The apparatus according to claim 1, wherein the plurality segments may be discharged at different moments in time.

8. The apparatus according to claim 1, wherein:
    the plurality of segments includes pairs of conductive segments;
    each pair of conductive segments is positioned at the same distance from each end of transmission line; and
    upper conductive segments are all coupled to lower conductive segments through the switches.

9. The apparatus according to claim 1, wherein the segments are charged and discharged through switches.

10. The apparatus according to claim 1, wherein the switches are optically activated.

11. The apparatus according to claim 1, wherein the plurality segments includes pairs of conductive segments that are discharged at the same moment in time.

12. The apparatus according to claim 11, wherein adjacent pairs of conductive segments are charged to a different voltage potential relative each other.

13. The apparatus according to claim 1, wherein the transmission line is coupled to a load on an operative end.

14. The apparatus of claim 13, wherein the load is an adiabatic transformer.

* * * * *